(12) United States Patent
Ali

(10) Patent No.: US 7,034,736 B1
(45) Date of Patent: Apr. 25, 2006

(54) PROCESSING SYSTEMS AND METHODS THAT REDUCE EVEN-ORDER HARMONIC ENERGY

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/980,051

(22) Filed: Nov. 2, 2004

(51) Int. Cl.
*H03M 1/44* (2006.01)
(52) U.S. Cl. ........................ 341/162; 341/122; 327/91; 327/337
(58) Field of Classification Search ................ 341/122, 341/161, 143, 162, 163, 172; 327/91, 96, 327/337
See application file for complete search history.

(56) References Cited

U.S. PATENT DOCUMENTS

| | | | | |
|---|---|---|---|---|
| 4,896,156 | A * | 1/1990 | Garverick | 341/143 |
| 5,001,725 | A * | 3/1991 | Senderowicz et al. | 341/143 |
| 5,030,954 | A * | 7/1991 | Ribner | 341/172 |
| 5,594,445 | A * | 1/1997 | Ginetti | 341/162 |
| 5,844,431 | A | 12/1998 | Chen | 327/94 |
| 5,945,872 | A | 8/1999 | Robertson et al. | 327/541 |
| 6,060,937 | A | 5/2000 | Singer et al. | 327/390 |
| 6,072,355 | A * | 6/2000 | Bledsoe | 327/390 |
| 6,255,865 | B1 | 7/2001 | Opris | 327/94 |
| 6,323,697 | B1 | 11/2001 | Pavan | 327/94 |
| 6,400,302 | B1 | 6/2002 | Amazeen | 341/172 |
| 6,404,376 | B1 * | 6/2002 | Kalthoff et al. | 341/172 |
| 6,518,901 | B1 | 2/2003 | Pinna et al. | 341/122 |
| 6,525,682 | B1 | 2/2003 | Yap et al. | 341/137 |
| 6,650,263 | B1 | 11/2003 | Dillon | 341/122 |
| 6,686,860 | B1 * | 2/2004 | Gulati et al. | 341/155 |
| 6,724,236 | B1 | 4/2004 | Sarraj | 327/390 |

OTHER PUBLICATIONS

Jakonia, Darius, "RF Sampling Receiver", Department of Electrical Engineering, Linkoping University, Linkoping, Sweden, pp. 1-4, no date.
Brannon, Brad, "Overcoming Converter Nonlinearities with Dither", Analog Devices Application Note AN-410, Norwood, MA, pp. 1-8, no date.
Kikkert, C. J., et al., "Reducing Distortion in Microwave Analogue to Digital Conversion", Electrical and Computer Engineering, James Cook University, Townsville, Australia, pp. 1-4, no date.
Karki, Jim, "Fully Differential Amplifiers Remove Noise from Common-Mode Signals" EDN Magazine, Nov. 9, 2000, pp. 149-156.

\* cited by examiner

*Primary Examiner*—Howard L. Williams
(74) *Attorney, Agent, or Firm*—Koppel, Patrick & Heybl

(57) ABSTRACT

Differential processing systems are provided that reduce even-order harmonic energy. The reduction may be selectively converted to, for example, random noise. This effects a tradeoff for processing systems that can afford to accept some increase in noise to thereby gain the benefits of reduction in even-order harmonic energy. In one system embodiment, first and second signal portions of a differential signal are respectively processed along first and second signal paths in a first processing mode and along the second and first signal paths in a second processing mode. The modes are selected to perform the desired conversion of even-order harmonic energy. In another system embodiment, first and second signal portions of a differential signal are processed along first and second signal paths in a first processing mode and inverted versions of these signals are processed along the first and second signal paths in a second processing mode. In addition, output signals are inverted in the second processing mode.

37 Claims, 6 Drawing Sheets

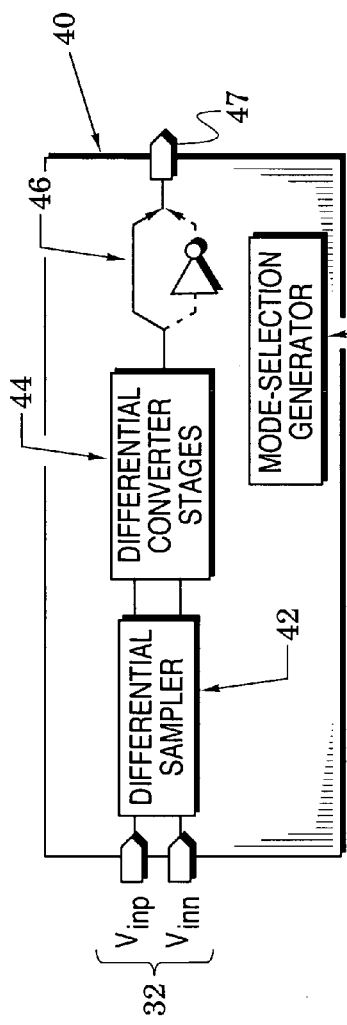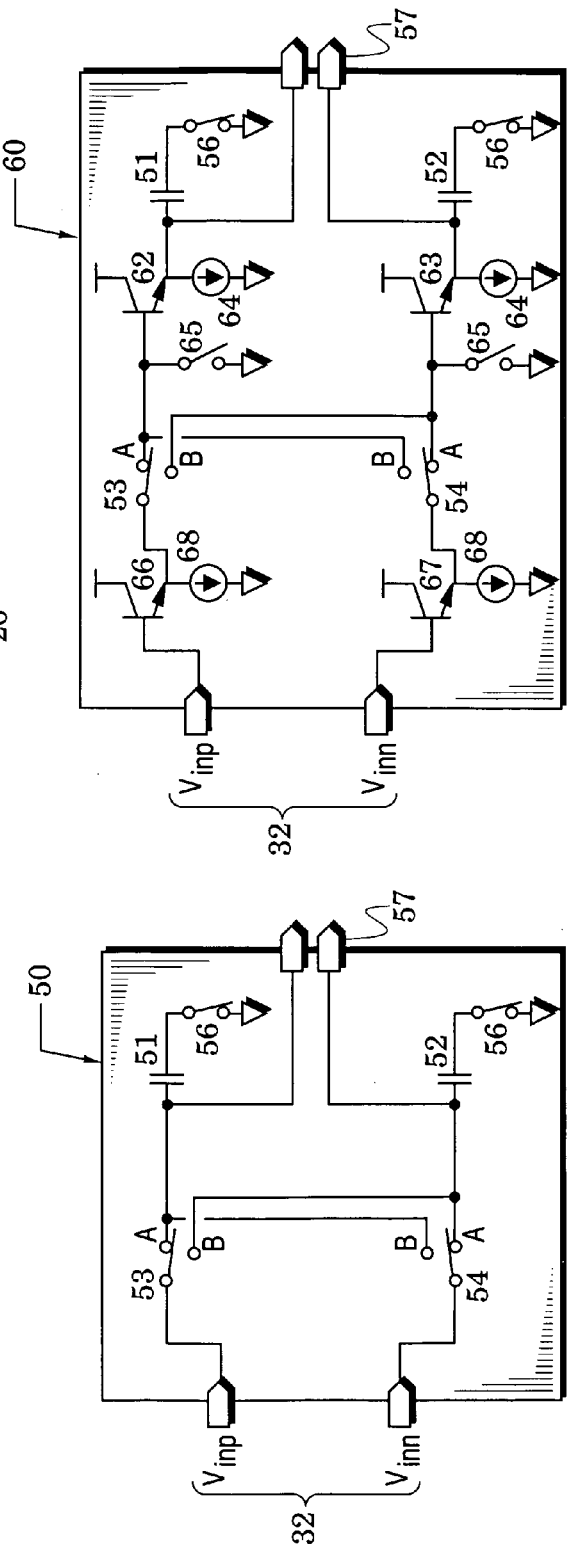
FIG. 2
FIG. 3A
FIG. 3B

PROCESSING SYSTEMS AND METHODS THAT REDUCE EVEN-ORDER HARMONIC ENERGY

BACKGROUND OF THE INVENTION

1. Field of the Invention

The present invention relates generally to differential processing systems.

2. Description of the Related Art

A variety of modern signal processing systems (e.g., analog-to-digital converters) process differential signals along differential paths with converter output signals obtained as the difference between the paths' differential output signals. This differential processing has historically been effective in reducing even-order harmonic energy. As the speed and linearity demands of these processing systems relentlessly increase, however, it is now often found that signal harmonics remain excessive.

BRIEF SUMMARY OF THE INVENTION

Embodiments of the present invention are directed to differential processing systems and methods that reduce even-order harmonic energy. The novel features of these embodiments are set forth with particularity in the appended claims. These embodiments will be best understood from the following description when read in conjunction with the accompanying drawings.

BRIEF DESCRIPTION OF THE DRAWINGS

FIG. 2 is a block diagram of an embodiment of the system of FIG. 1 that converts analog signals to corresponding digital signals;

FIGS. 3A, 3B, 3C and 3D are schematics of sampler embodiments for use in the system of FIG. 2;

DETAILED DESCRIPTION OF THE INVENTION

Embodiments of the present invention are directed to the recognition that it is difficult (if not impossible) to perfectly match transfer functions of the paths of differential processing systems and that it is also difficult to generate perfectly matched differential signals so that some degree of signal imbalance will always exist in these systems. In response to these recognitions, processing system embodiments are provided which are particularly suited to reduce even-order harmonic energy generated by path and signal imbalances. These embodiments also reduce offset errors which are a form of even-order harmonic energy. Included are embodiments that address signal imbalances so that they also reduce DC input signals which are another form of even-order harmonic energy.

Figure 1:
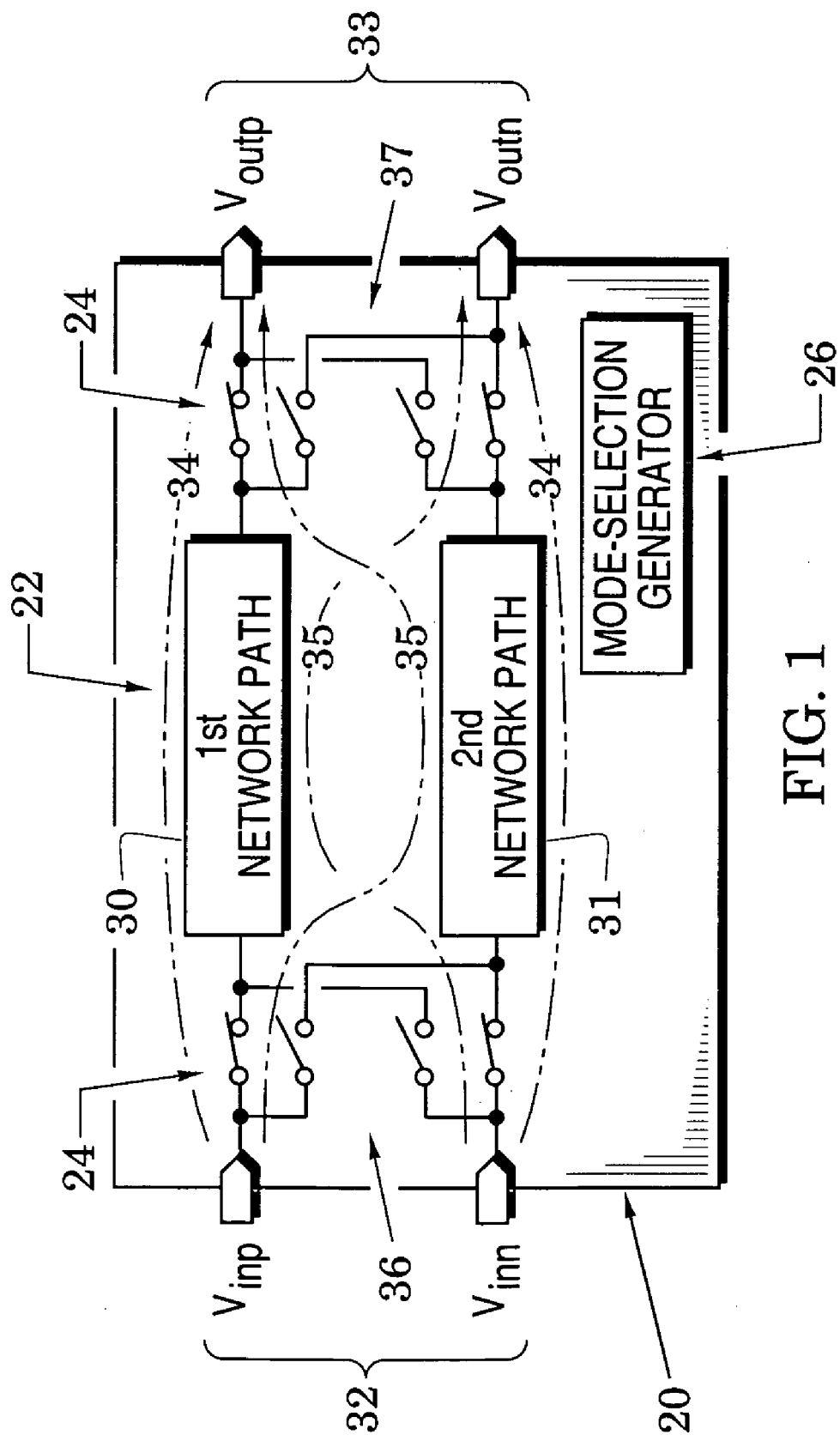
FIG. 1 is a block diagram of a processing system embodiment of the present invention.

In particular, FIG. 1 illustrates a differential processing system 20 that includes a differential network 22, a coupling circuit 24 and a mode-selection generator 26. The differential network 22 processes differential input signals along first and second network paths 30 and 31 and the coupling circuit 24 is arranged to respectively direct first and second signal portions of the differential input signals along the first and second network paths in a first processing mode and along the second and first networks in a second processing mode.

In the first processing mode, first and second signal portions $V_{inp}$ and $V_{inn}$ of a differential input signal 32 are processed along the first and second network paths 30 and 31 as indicated by the processing paths 34 and, in the second processing mode, respectively processed along the second and first network paths as indicated by the processing paths 35 (wherein subscripts p and n indicate positive and negative signal portions).

The coupling circuit 24 includes an input switch circuit 36 and an output switch circuit 37 which are configured to steer the signal portions along the paths described above (the switches are all shown in the first processing mode in FIG. 1). Both processing modes thus generate first and second signal portions $V_{outp}$ and $V_{outn}$ of a differential output signal 33 but do so over different differential paths. The mode-selection generator 26 is then configured (e.g., as a random number generator) to selectively command the first and second processing modes.

Imbalances in the first and second network paths (i.e., differences in path transfer functions) will generate even-order harmonics when first and second signal portions of a differential signal are respectively processed over those paths. Because the system 20 selectively directs each of the first and second signal portions over different ones of the first and second network paths, the effects of these path imbalances are substantially reduced with a consequent enhancement of processing linearity and a lowering of even-order harmonics in the differential output signal 33.

If the selection processes of FIG. 1 are random, they essentially convert even-order harmonic energy to random noise. This tradeoff of reduced even-order harmonic energy for increased random noise is often a desirable choice. That is, many processing systems can afford to accept some increase in noise to thereby gain the benefits of the reduced even-order harmonic energy.

The signals processed through the differential processing system 20 may be analog, digital or mixtures thereof. In an exemplary processing system, the network paths 30 and 31 may convert a differential analog input signal 32 to a corresponding digital output signal. FIG. 2 illustrates a differential processing system 40 of this type that includes a differential sampler 42 which initiates the first and second processing paths and provides differential samples of the first and second signal portions $V_{inp}$ and $V_{inn}$. The system 40 also includes at least one differential converter stage 44 that successively converts the differential samples to corresponding digital signals which form the system output signals.

The system further includes the mode-selection generator 26 of FIG. 1 but it replaces the output switch circuit (37 in FIG. 1) with a digital inverter 46 that provides output signals at an output port 47. The differential sampler 42 is configured to have first and second sampling modes that process differential signals over different paths and these modes are commanded by the mode-selection generator The inverter 46 of FIG. 2 is symbolized by a through path that would be used in the first processing mode and an inverter that would be used in the second processing mode. In one embodiment, a digital inverter is simply activated (to its inverting mode) in the second processing mode. The inverter thus equivalently performs the same signal inversion as the output switch circuit 37 of FIG. 1—i.e., it passes the digital output signals in the first processing mode and inverts the digital output signals in the second processing mode. The inverter circuit is generally easier to realize in analog-to-digital converter embodiment.

As shown in FIG. 3A, an exemplary differential sampler 50 includes first and second capacitors 51 and 52 whose upper plates can be respectively coupled to the first and second signal portions $V_{inp}$ and $V_{inn}$ through switch nodes A of switches 53 and 54 and respectively coupled to the second and first signal portions through switch nodes B of these switches. Each of the lower plates of the capacitors 51 and 52 is coupled to ground through a respective one of a pair of switches 56. Finally, an output port 57 is coupled to the upper plates of the capacitors 51 and 52.

In a first operational mode, the switches 56 are momentarily closed and the switches 53 and 54 are momentarily placed in contact with their switch nodes A to thereby capture samples of the input signal on the capacitors 51 and 52. The switches 56 are then opened and the switches 53 and 54 are moved from their switch nodes A to complete the capture and to permit the captured signal sample to be transferred to processing systems via differential port 57. This capture process is repeated successively as long as the sampler is in its first operational mode.

In a second operational mode, the switches 56 are momentarily closed and the switches 53 and 54 are momentarily placed in contact with their switch nodes B to thereby capture samples of the input signal on the capacitors 51 and 52 in a reversed orientation. The switches 56 are then opened and the switches 53 and 54 are moved from their switch nodes B to complete the capture and to permit the captured signal sample to be transferred to processing systems via differential port 57. This capture process is repeated successively as long as the sampler is in its second operational mode. After capture of the signal samples, they are passed through the output port 57 to initiate the conversion processes of the differential converter stages (44 in FIG. 2).

The first and second operational modes can be selected so that signal samples are directed over different signal paths. Accordingly, the distorting effects of path imbalances are substantially reduced with a consequent enhancement of processing linearity and a lowering of even-order harmonics in the differential output signal. If the selection is random, the even-order harmonic energy is converted to random noise. Preferably, the downstream switches 56 close and open just prior to the closing and opening of the upstream switches 53 and 54 to thereby reduce the capture of switching-transient energy in the capacitors.

FIG. 3B illustrates another differential sampler embodiment 60 that is similar to the sampler 50 with like elements indicated by like reference numbers. The sampler 60 inserts first and second buffer transistors 62 and 63 between the first and second switches and the first and second capacitors (each buffer has a corresponding current source 64). The buffers are arranged as emitter followers that can be enabled to capture signal samples on the first and second capacitors and then disabled (e.g., by grounding bases through shorting switches 65) as these samples are being processed through the converter stages (44 in FIG. 2).

The upstream isolation provided by the downstream current gain (upstream current loss) of the buffers 62 and 63 has been found to enhance the accuracy of the signal samples. This isolation is further enhanced by inserting third and fourth buffer transistors 66 and 67 ahead of the first and second switches 53 and 54 (each buffer has a corresponding current source 68).

Figure 3D:
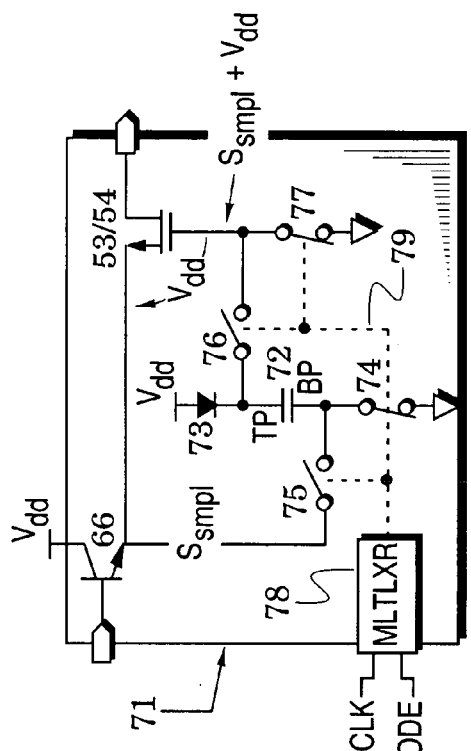
Figure 3C:
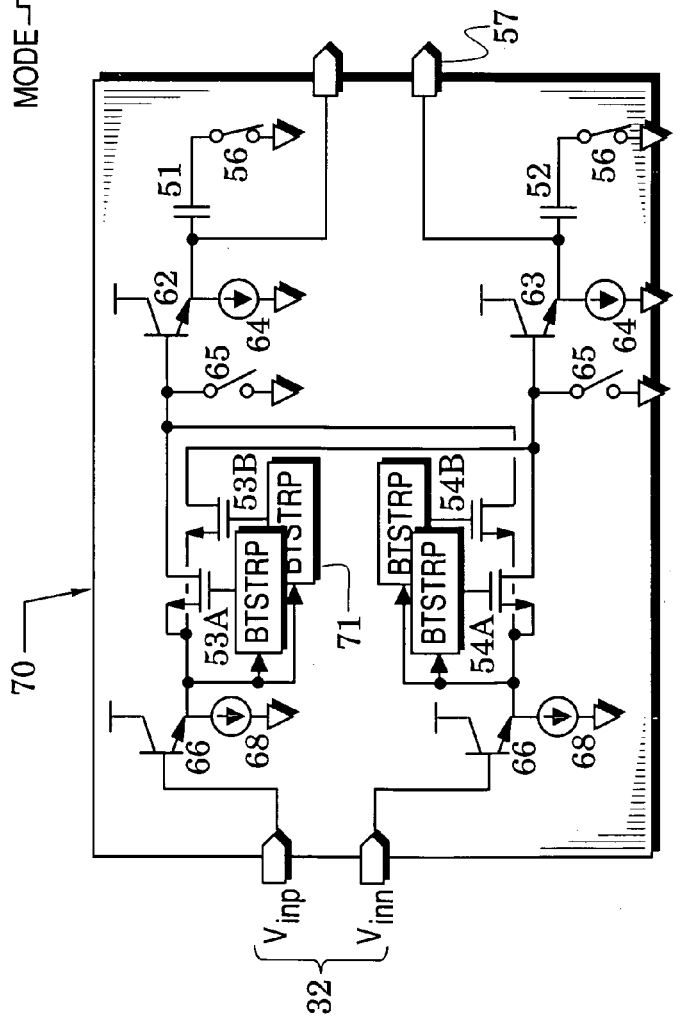

FIG. 3C illustrates a differential sampler embodiment 70 that is similar to the sampler 60 of FIG. 3B with like elements indicated by like reference numbers. The sampler 70 realizes the switch 53 of FIG. 3B with a pair of switch transistors 53A and 53B and realizes the switch 54 with a pair of switch transistors 54A and 54B. Sources of the transistors 53A and 53B are coupled to their respective upstream buffer 66 with their drains coupled respectively to downstream buffers 62 and 63. Sources of the transistors 54A and 54B are coupled to their respective upstream buffer 66 with their drains coupled respectively to downstream buffers 63 and 62.

A bootstrap system is formed by bootstrap modules 71 that are each coupled between source and gate of a corresponding one of the switch transistors. FIG. 3D illustrates an embodiment of the modules 71 in which the top plate TP of a bootstrap capacitor 72 is coupled to a diode 73 and the bottom plate BP is coupled to a switch 74.

A second switch 75 couples the bottom plate BP to the output of the upstream buffer 66 and a third switch 76 couples the top plate TP to the gate of one of the switch transistors (53A, 53B, 54A and 54B of FIG. 3C which are indicated here, for simplicity, as a switch transistor 53/54. A fourth switch 77 couples the gate of the switch transistor 53/54 to ground. The switches 74, 75, 76 and 77 are controlled via broken-line switch commands 79 output by a multiplexer 78 in response to clock signals and a mode command signal.

When the mode command is in a first mode, a first clock state closes switch 74 to insert a bias current in the bootstrap capacitor 72 via diode 73 and a supply voltage (e.g., $V_{dd}$). For simplicity of description, it is assumed there are no voltage drops across the diode 73 and the switch 74 so that a potential of substantially $V_{dd}$ is established across the bootstrap capacitor. The switch 77 is closed in this clock state so that the switch transistor 53/54 is off.

When the clock transitions to a second state, switches 74 and 77 are opened and switches 75 and 76 are closed. A signal sample $S_{smpl}$ is thus coupled from the upstream buffer 66 to the bottom plate BP. Accordingly, the top plate TP applies a bias of $S_{smpl}+V_{dd}$ to the gate of the switch transistor 53/54 so that a constant gate-to-source bias of $V_{dd}$ is established across this transistor as indicated in FIG. 3C.

Because the bias of the switch transistor includes the signal sample $S_{smpl}$, a constant bias voltage is applied to the switch transistor 53/54 so that its on resistance is substantially constant and the signal sample is transferred to the downstream buffer (62 or 63 in FIG. 3B) with enhanced fidelity. In absence of this bootstrapped bias, the gate-to-source bias of the switch transistor 53/54 (and its on resistance) would vary with differing values of the signal from the upstream buffer 66. This variance would degrade the fidelity of the transferred signal sample.

When the mode command transitions to a second mode, the multiplexer 78 sets the switch commands 79 to thereby lock the switches 74, 75, 76 and 77 in the positions shown in FIG. 3D. The switch transistor 53/54 is therefore deactivated and the capacitor 72 is isolated and holds its charge of substantially $V_{dd}$. In this second mode, the switches 74, 75, 76 and 77 no longer respond to the clock signal.

When the bootstrap module 71 is used to form the bootstrap modules in FIG. 3C, the multiplexer 78 is arranged so that modules 53A and 54A are always in a mode different from that of modules 53B and 54B. Thus, when switches 74, 75, 76 and 77 of modules 53A and 54A are responding to first and second clock states as described above, switches 74, 75, 76 and 77 of modules 53B and 53B are locked in the positions shown in FIG. 3D. Likewise, when switches 74, 75, 76 and 77 of modules 53B and 54B are responding to first and second clock states as described above, switches 74, 75, 76 and 77 of modules 53A and 53A are locked in the positions shown in FIG. 3D.

The first and second mode commands thus route the first and second signal portions of the differential signal 32 over different signal paths. The first and second signal portions respectively pass through buffers 62 and 68 in one mode and respectively pass through buffers 63 and 62 in another mode. The distorting effects of path imbalances are thus reduced, processing linearity is enhanced and even-order harmonics are lowered.

Figure 4:
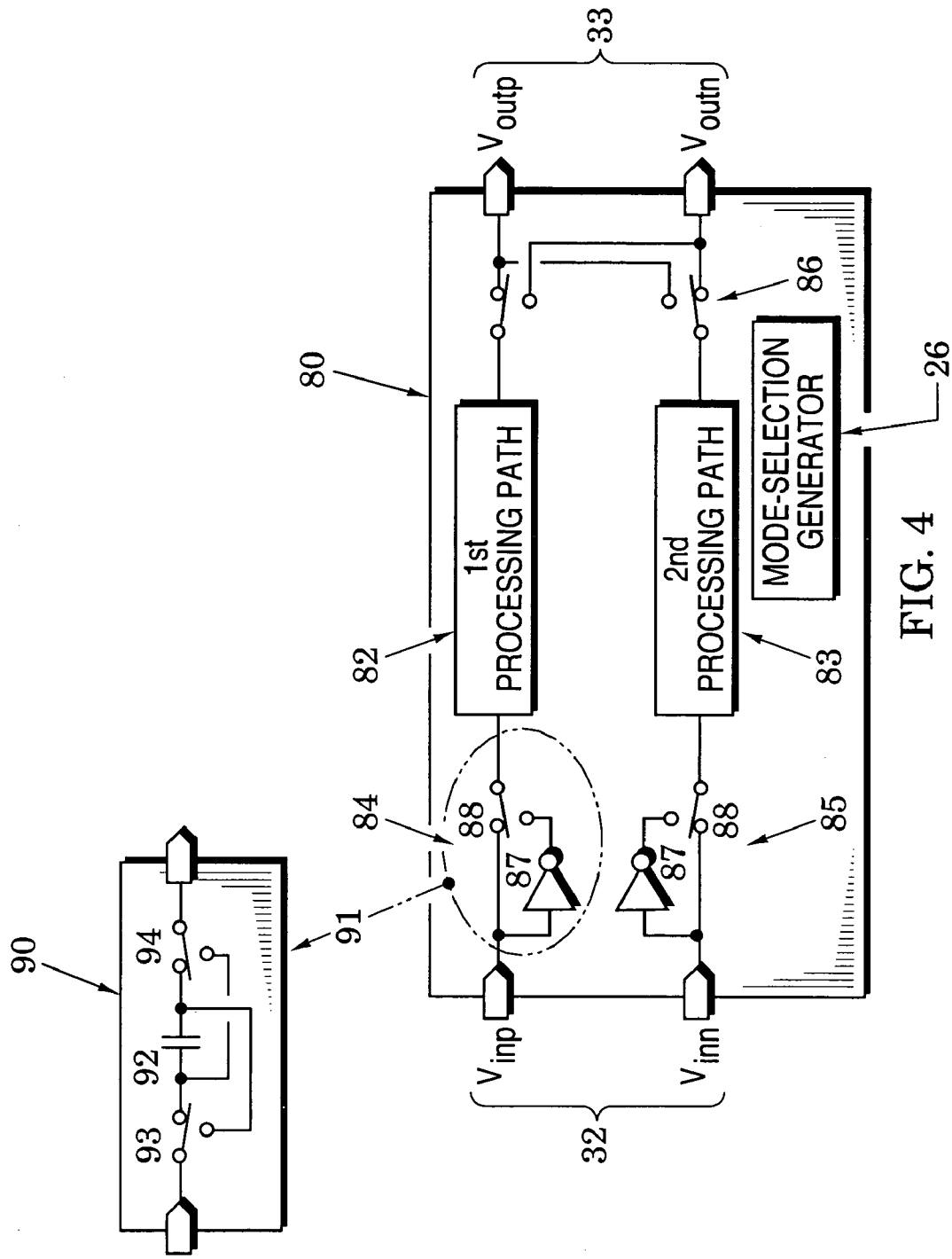
FIG. 4 is a block diagram of another processing system embodiment.

FIG. 4 illustrates another differential processing system 80 that processes differential input signals along first and second processing paths 82 and 83 wherein the processing paths are respectively initiated by first and second signal inverter networks 84 and 85 that respectively pass first and second signal portions of the differential input signals in a first processing mode and invert the first and second signal portions in a second processing mode. The processing paths are terminated by a terminal signal inverter 86 that inverts output signals of the differential network in the second processing mode. The system also includes the mode-selection generator 26 (introduced in FIG. 1) that alternates (e.g., randomly) the first and second processing modes.

In a first processing mode of the system 80, first and second signal portions $V_{inp}$ and $V_{inn}$ of the differential signal are respectively processed along the first and second processing paths 82 and 83. In a second processing mode, first and second inverted versions of the first and second signal portions are formed by the inverters 84 and 85 and these inverted versions are processed along the first and second signal paths after which the corresponding signal outputs of the first and second processing paths are inverted in the inverter 86 (the inverter is not activated in the first processing mode). Similar to the processing system 20 of FIG. 1, the mode-selection generator 26 commands the first and second processing modes.

This method of reducing harmonic energy not only addresses path imbalances (imbalances in the first and second processing paths) but also signal imbalances (imbalances in the differential nature of the first and second signal portions $V_{inp}$ and $V_{inn}$ of the differential input signal 32). The system selectively (e.g., randomly) processes these signal portions and the inverted versions of these signal portions and, when it processes the inverted versions, it then inverts the system's output signals.

In FIG. 4, the inverter networks 84 and 85 are realized with inverters 87 which are selected in the second processing mode by activating switches 88. In a sampled-data system, these inverter networks can be replaced by another inverter embodiment 90 as indicated by a replacement arrow 91. The inverter 90 is a reversible-capacitor network that presents a capacitor 92 in a first arrangement in the first processing mode and in a reversed arrangement in the second processing mode to thereby invert the input signal in the second processing mode. The reversible-capacitor network positions the capacitor 92 between first and second reversing switches 93 and 94 which are in the position shown in the first processing mode and in a second position in the second processing mode.

Figure 5:
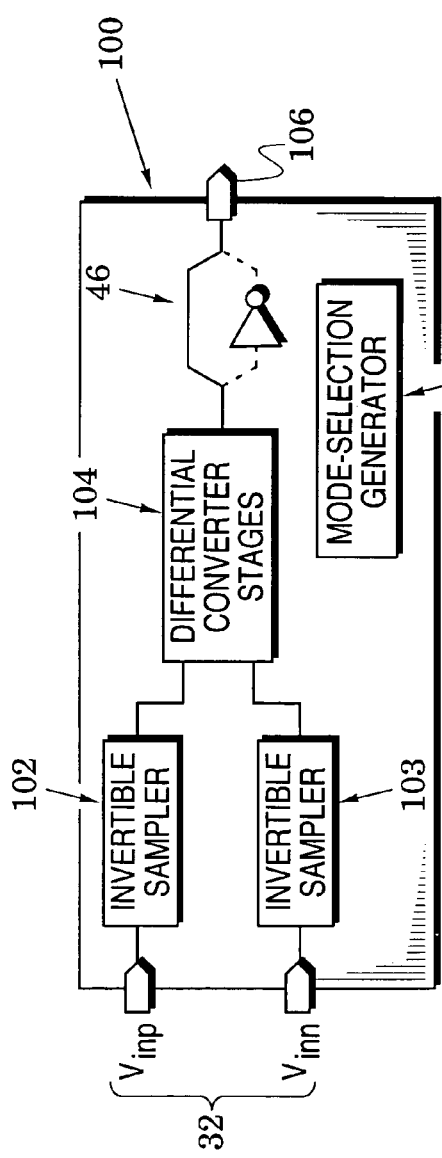
FIG. 5 is a block diagram of an embodiment of the system of FIG. 4 that converts analog signals to corresponding digital signals.

FIG. 5 illustrates an embodiment 100 of the differential processing system of FIG. 4 that converts a differential analog input signal 32 to a corresponding digital output signal at an output port 106. The system 100 has a differential network that is initiated by first and second invertible samplers 102, has a plurality of differential converter stages 104 and is terminated by the digital inverter 46 that was introduced in FIG. 2.

The invertible samplers 102 and 103 provide differential samples of the first and second signal portions in the first processing mode and invert differential samples in the second processing mode. The converter stages 104 then successively convert the differential samples to corresponding digital signals at the output port 106 and the mode-selection generator 26 selectively commands the first and second processing modes.

Figure 6:
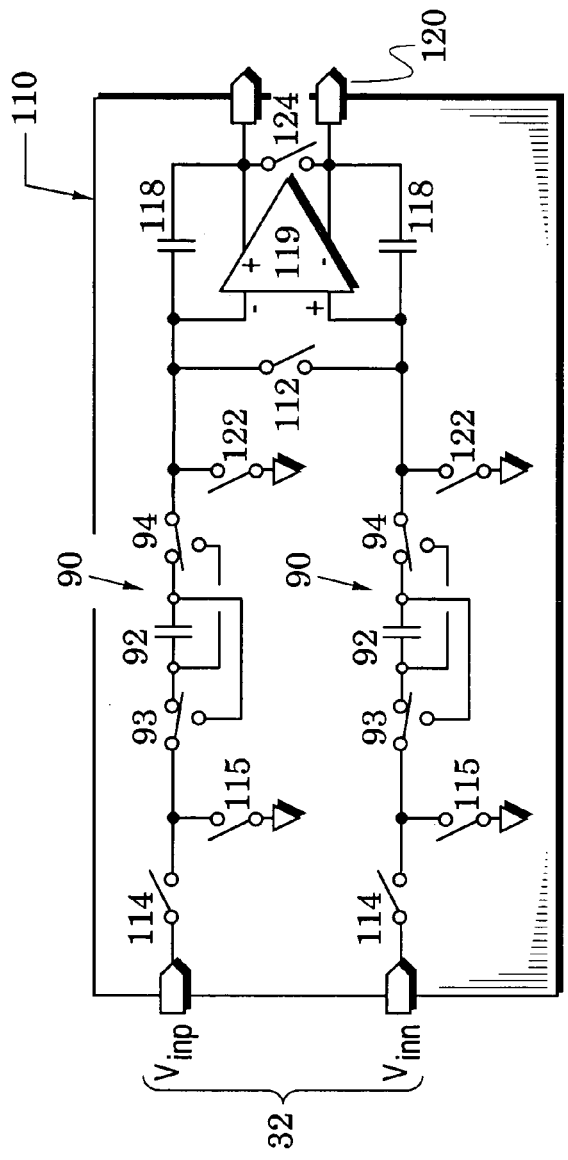
FIG. 6 is a schematic of a sampler embodiment for use in the system of FIG. 5.

FIG. 6 illustrates an embodiment 110 of the invertible samplers 102 and 103 of FIG. 5. This embodiment positions reversible-capacitor networks 90 (introduced in FIG. 4) between a downstream sampling switch 112 and upstream sampling switches 114. In sampling operations during the first processing mode, samples of the first and second signal portions $V_{inp}$ and $V_{inn}$ are captured in the capacitors 92 by closing the sampling switches (the upstream switch is preferably closed first to reduce switching transients in the captured signals).

The sampling switches 112 and 114 are then returned to the open positions shown and transfer switches 115 are closed to transfer the captured signal charge into output capacitors 118 that provide feedback about a differential amplifier 119 which drives an output port 120. The differential output signals of the amplifier are then differentially and successively converted to digital signals in succeeding converter stages (104 of FIG. 5). At the end of each sampling process, the shorting switch 124 dumps the charge in the output capacitors 118.

The sampling operations during the second processing mode of the invertible sampler 110 of FIG. 6 differ from those described above in the first processing mode. This difference occurs between the time during which samples have been captured in the capacitors 92 and the time when the sample charges are transferred to the output capacitors 118.

Between these operations, the reversing switches 93 and 94 are switched to positions opposite those shown in FIG. 6 which effectively inverts the signal sample. Preferably, an adjusting switch 122 is inserted after each reversible-capacitor network 90 and this switch is briefly closed just as the capacitors 92 are reversed to thereby restore the common-mode voltage to what was previously the upstream nodes of the capacitors 92. This brief closure does not substantially alter the captured charge.

The mode-selection generator 26 of FIG. 5 commands these first and second processing modes of the invertible sampler 110. It is also noted that the first and second buffer transistors 62 and 63 of FIG. 3B may be inserted between the sampling switches 114 and the transfer switches 115 to provide isolation and enhance the accuracy of the signal samples.

As mentioned above, embodiments of the invention address even-order harmonic energy generated by system path imbalances. The embodiments are effective for reducing even-order harmonics in the system output signal by, for example, converting them into random noise. It is further noted that the energy portion converted can be controlled by selecting the ratio of times devoted to the first and second processing modes.

In the system 20 of FIG. 1, for example, the first and second signal portions $V_{inp}$ and $V_{inm}$ of a differential input signal 32 are processed along the processing paths 34 in the first processing mode and along the processing paths 35 in the second processing mode. The maximum conversion (e.g., to random noise) will be realized when the probability for each path is substantially 50%. Skewing the probability away from 50% will reduce the conversion.

Accordingly, the conversion in specific processing systems can be controlled to optimize a tradeoff between harmonic performance and noise performance. It is important to note that offset errors are a form of even-order harmonic energy which are included in the system path imbalances. Therefore, embodiments of the invention also reduce offset errors.

Other embodiments of the invention address even-order harmonic energy generated by both system path imbalances and input signal imbalances. For example, the differential processing system 100 of FIG. 5 addresses imbalances in the differential nature of the first and second signal portions $V_{inp}$ and $V_{inm}$. It is important to note that DC input signals are a form of even-order harmonic energy which are included in the input signal imbalances so that these embodiments of the invention are effective in reducing DC input signals (by converting them, for example, to random noise).

In an application of these embodiments, performance of a differential processing system can be measured with and without the correction processes (i.e., without use of the second processing path 35 of FIG. 1 or without signal inversion as shown in FIG. 4). If the system is ideal (e.g., no difference in transfer functions of processing paths), the performance will be identical with and without the correction processes. Otherwise, the difference provides a measure of the differential error and this measure can be applied as a calibration factor (e.g., offset calibration factor and/or gain calibration factor) to the processed output signals. The calibration operation can be performed in parallel with the normal operation of the system or interleaved with the normal operation.

Simulations were run on system embodiments of the invention. A first simulation was directed to an exemplary differential system that had no input signal imbalance but a 10% path imbalance. When operated single-endedly, the system exhibited a 65 dB second harmonic (that is, the second harmonic was 65 dB below the fundamental signal). When operated differentially, the system exhibited an 85 dB second harmonic and 110 dB third harmonic. With use of the differential processing of embodiments of the invention, the second harmonics were virtually eliminated, the third harmonic remained at 110 dB and, although the noise level was raised, the signal-to-noise ratio remained at 87 dB.

A second simulation was directed to an exemplary differential system that had a 5% input signal imbalance and a 1% path imbalance. When operated single-endedly, the system exhibited a 65 dB second harmonic. When operated differentially, the system exhibited an 85 dB second harmonic and a 110 dB third harmonic. With use of the differential processing of embodiments of the invention that did not address signal imbalance (e.g., the systems 20 and 40 of FIGS. 1 and 2), the differential second harmonic was reduced to 82 dB, the third harmonic remained at 110 dB and, although the noise level was raised, the signal-to-noise ratio remained at 78 dB.

With use of the differential processing of embodiments of the invention that addressed signal imbalance (e.g., the systems 80 and 100 of FIGS. 4 and 5), the differential second harmonics were substantially eliminated, the third harmonic remained at 110 dB and, although the noise level was raised, the signal-to-noise ratio remained at 75 dB. In this simulation, 12-bit gain error and a 6-bit offset error were used to apply calibration corrections. When the gain error correction was increased to 14 bits, the differential second harmonics were substantially eliminated, the third harmonic remained at 110 dB and the signal-to-noise ratio dropped to 78 dB.

Figure 7:
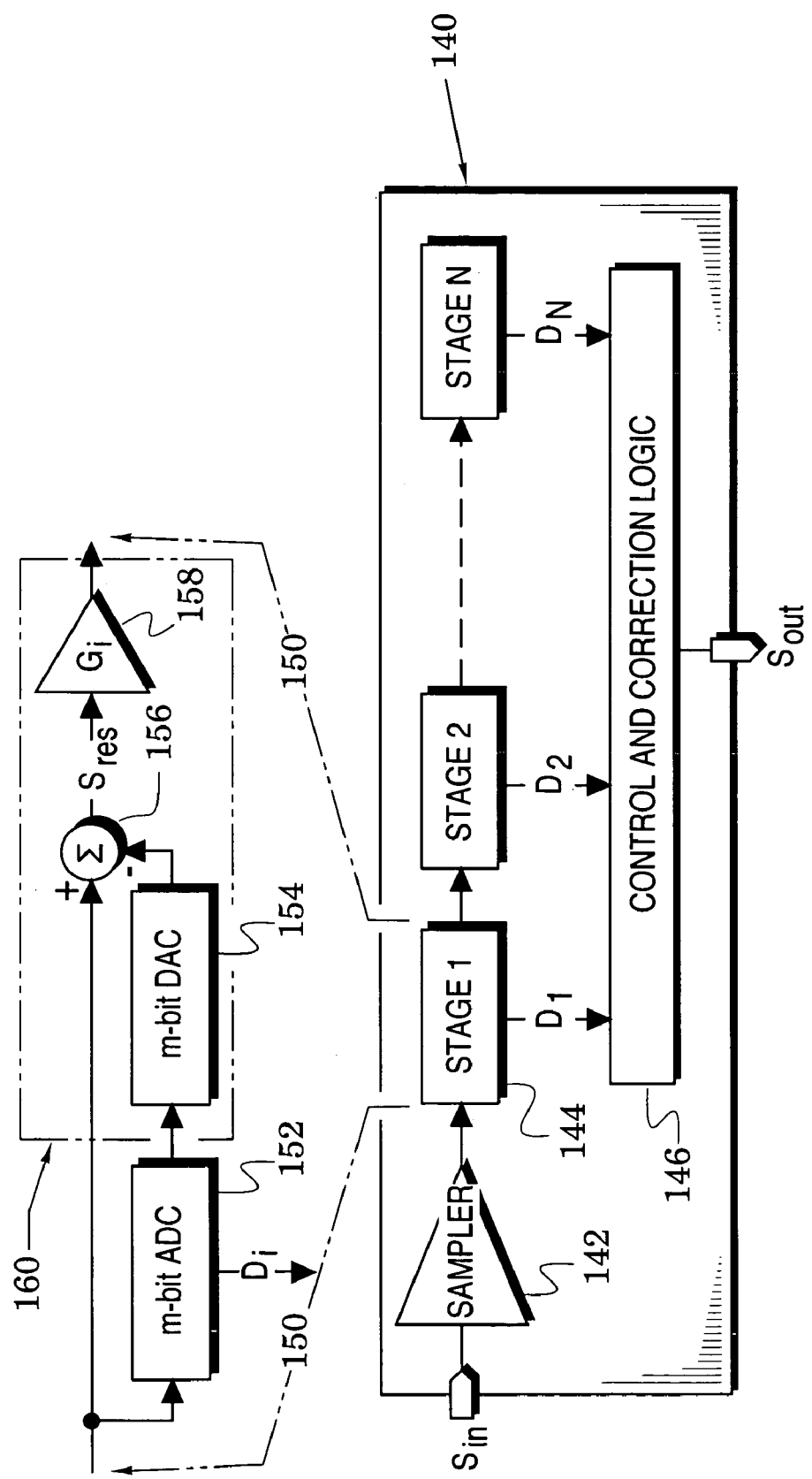
FIG. 7 is a block diagram of an exemplary analog-to-digital converter that can be configured in accordance with the processing system embodiments of the present invention.

The teachings of embodiments of the invention can be applied to various differential processing systems such as the exemplary pipelined analog-to-digital converter (ADC) 140 of FIG. 7 which includes a sampler 142 that provides samples of an analog input signal $S_{in}$ to N cascaded converter stages that successively convert each sample to a corresponding digital output signal $S_{out}$.

Each pipelined stage 144 converts a respective analog signal to that stage's predetermined number of digital bits and passes an amplified residue signal $S_{res}$ to a succeeding converter stage 144. As each succeeding stage converts its received residue signal, its preceding stage is converting a succeeding analog input signal. All converter stages, therefore, are simultaneously converting succeeding analog input signals to their respective digital bits with final converted words issuing from an associated control and correction logic 146 at the same rate as the sampling rate in the sampler 142.

Broken expansion lines 150 in FIG. 7 indicate that an exemplary converter stage comprises an ADC 152 which provides at least one corresponding digital bit $D_i$ and also comprises a digital-to-analog (DAC) 154 that converts this bit (or bits) to an analog signal which is subtracted in a summer 156 from this stage's respective analog input to form an analog residue $S_{res}$ that is amplified in a respective amplifier 158 with a respective gain G and passed to a successive converter stage for further conversion. The DAC 154, summer 156 and amplifier 158 are generally referred to as a multiplying digital-to-analog converter (MDAC) which is collectively shown as the broken-line element 160. MDACs are often realized with switched-capacitor networks which make them particularly suitable for integration with the samplers of embodiments of the invention that utilize switched capacitors (e.g., the reversible-capacitor network 90 of FIG. 4).

Generally, one or more redundant bits are generated in the converter stages and the control and correction logic 146 includes circuits (e.g., full adders) that use the bits of succeeding stages to correct preceding-stage errors that result from various degrading effects (e.g., offset and/or gain errors) and also includes circuits (e.g., shift registers) that time-align the corresponding digital bits.

In addition to the sampler 142, additional samplers may be positioned between converter stages to temporarily hold the residue signals and, thereby, facilitate conversion processing. The enhanced linearity of the samplers of embodiments of the invention significantly improves the accuracy of the samples presented to the conversion stages of the ADC 140 and thereby significantly improves the performance of the ADC.

Although the invertible sampler 110 of FIG. 6 has been illustrated for use in processing differential first and second signal portions $V_{inp}$ and $V_{inm}$ (e.g., as in the system 100 of FIG. 5), embodiments of this sampler may also be advantageously used to process single-ended signals that are applied to both sides of the sampler.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of reducing harmonic energy when processing a differential signal, comprising the steps of:
    in a first processing mode, respectively processing first and second signal portions of said differential signal along first and second signal paths;
    in a second processing mode, respectively processing said first and second signal portions along said second and first signal paths; and
    alternating between said first and second processing modes wherein said alternating step includes the step of randomly selecting said first and second processing modes.

2. The method of claim 1, wherein:
    said processing step of said first processing mode includes the step of respectively switching said first and second signal portions through said first and second signal paths; and
    said processing step of said second processing mode includes the step of respectively switching said first and second signal portions through said second and first signal paths.

3. The method of claim 1, wherein each of said processing steps includes the step of converting said differential signal to a corresponding digital output signal.

4. The method of claim 3, wherein each of said processing steps includes the step of providing samples of said differential signal.

5. The method of claim 3, wherein one of said processing steps includes the step the step of inverting said digital output signal.

6. A method of reducing harmonic energy when processing a differential signal, comprising the steps of:
    in a first processing mode, respectively processing first and second signal portions of said differential signal along first and second signal paths;
    in a second processing mode,
        a) respectively processing first and second inverted versions of said first and second signal portions along said first and second signal paths; and
        b) inverting the corresponding signal outputs of said first and second signal paths; and
    alternating between said first and second processing modes.

7. The method of claim 6, wherein said alternating step includes the step of randomly selecting said first and second processing modes.

8. The method of claim 6, wherein each of said processing steps includes the step of converting said differential signal to a corresponding digital output signal.

9. The method of claim 8, wherein each of said processing steps includes the step of providing samples of said differential signal.

10. The method of claim 8, wherein one of said processing steps includes the step of inverting said first and second signal portions.

11. The method of claim 8, wherein said inverting step includes the step of inverting said digital output signal.

12. A differential sampler that provides samples of differential input signals, comprising:
    first and second capacitors;
    first and second switches that respectively couple first and second signal portions of said differential input signals through said first and second capacitors in a first sample mode and to said second and first capacitors in a second sample mode; and
    a mode-selection generator that randomly selects said first and second sample modes.

13. The sampler of claim 12, further including:
    a first buffer transistor inserted between said first switch and said first capacitor; and
    a second buffer transistor inserted between said second switch and said second capacitor.

14. The sampler of claim 13, further including:
    a third buffer transistor inserted before said first switch; and
    a fourth buffer transistor inserted before said second switch.

15. A differential sampler that samples a differential signal in response to a clock and first and second mode commands comprising:
    first and second capacitors;
    first and second transistors arranged to respectively pass first and second signal portions of said differential signal to said first and second capacitors respectively;
    third and fourth transistors arranged to respectively pass said first and second signal portions to said second and first capacitors respectively; and
    a bootstrap system that:
        in response to said first mode command, deactivates said third and fourth transistors and, in response to said clock, momentarily activates said first and second transistors with respective first and second bias signals that respectively include samples of said first and second signal portions; and
        in response to said second mode command, deactivates said first and second transistors and, in response to said clock, momentarily activates said third and fourth transistors with respective third and fourth bias signals that respectively include samples of said first and second signal portions;
    and further including:
    a first buffer transistor inserted between said first capacitor and said first and fourth transistors; and
    a second buffer transistor inserted between said second capacitor and said second and third transistors.

16. The sampler of claim 15, wherein, for each of said transistors, said system includes:
    a bias capacitor;
    at least one switch arranged to insert a bias current into said bias capacitor in response to an absence of said clock; and
    at least one switch arranged to couple, in response to said clock, said bias capacitor between a respective one of said first and second signal portions and a respective one of said transistors.

17. The sampler of claim 15, wherein, for each of said transistors, said system further includes at least one switch arranged to apply a deactivating bias to a respective one of said transistors in response to a respective one of said first and second mode commands.

18. The sampler of claim 15, further including:
    a third buffer transistor inserted before said first and third transistors; and
    a fourth buffer transistor inserted before said second and fourth transistors.

19. The sampler of claim 15, further including a mode-selection generator that provides said first and second mode commands.

20. A differential processing system, comprising:
a differential network that processes differential input signals along first and second network paths;
a coupling circuit arranged to respectively direct first and second signal portions of said differential input signals along said first and second network paths in a first processing mode and along said second and first networks in a second processing mode; and
a mode-selection generator that randomly alternates said first and second processing modes.

21. The system of claim 20, wherein said coupling circuit includes:
an input switch circuit arranged to respectively couple said first and second signal portions into said first and second network paths in said first processing mode and into said second and first network paths in said second processing mode; and
an output switch circuit arranged to respectively extract processed versions of said first and second signal portions from said first and second network paths in said first processing mode and from said second and first network paths in said second processing mode.

22. A differential processing system comprising:
a differential network that processes differential input signals along first and second network paths;
a coupling circuit arranged to respectively direct first and second signal portions of said differential input signals alone said first and second network paths in a first processing mode and along said second and first networks in a second processing mode; and
a mode-selection generator that alternates said first and second processing modes;
wherein said differential network provides single-ended output signals from said first and second network paths in response to said differential input signals and said coupling circuit includes:
an input switch circuit arranged to respectively couple said first and second signal portions into said first and second network paths in said first processing mode and into said second and first network paths in said second processing mode; and
an inverter circuit that passes said output signals in said first processing mode and inverts said output signals in said second processing mode.

23. The system of claim 22, wherein said differential network comprises:
a differential sampler that initiates said first and second processing paths and provides differential samples of said first and second signal portions; and
a plurality of differential converter stages that complete said first and second processing paths and successively convert said differential samples to corresponding digital signals which form said output signals;
and wherein said inverter circuit is a digital inverter that is activated in said second processing mode.

24. The system of claim 23, wherein said sampler includes first and second capacitors and said input switch circuit includes first and second switches that respectively couple said first and second signal portions to said first and second capacitors in said first processing mode and to said second and first capacitors in said second processing mode.

25. The system of claim 24, wherein said differential sampler further includes:

a first buffer transistor inserted between said first switch and said first capacitor; and
a second buffer transistor inserted between said second switch and said second capacitor.

26. The system of claim 25, wherein said differential sampler further includes:
a third buffer transistor inserted before said first switch; and
a fourth buffer transistor inserted before said second switch.

27. The system of claim 26, wherein said mode-selection generator is a random number generator.

28. A differential sampler that provides samples of differential input signals to first and second network paths, comprising:
first and second reversible-capacitor networks that respectively present first and second capacitors in a first arrangement in a first sampling mode and in a reversed arrangement in a second sampling mode;
first and second switches positioned to couple first and second signal portions of said differential input signals through said first and second capacitors;
and
a mode-selection generator that randomly alternates said first and second sampling modes.

29. The sampler of claim 26, wherein each of said reversible-capacitor networks includes:
first and second reversing switches; and
a capacitor coupled between said reversing switches.

30. The sampler of claim 26, further including:
a first buffer transistor inserted before said first reversible-capacitor network; and
a second buffer transistor inserted before said second reversible-capacitor network.

31. A differential processing system, comprising:
a differential network that processes differential input signals along first and second network paths wherein said network includes:
a) first and second signal inverters that respectively pass first and second signal portions of said differential input signals in a first processing mode and invert said first and second signal portions in a second processing mode; and
b) a terminal signal inverter that inverts output signals of said differential network in said second processing mode; and
a mode-selection generator that alternates said first and second processing modes.

32. The system of claim 31, wherein each of said signal inverters includes:
an inverter; and
a switch arranged to insert said inverter into a respective one of said first and second network paths in said second processing mode;
and said terminal inverter includes first and second terminal switches arranged to exchange output signals of said first and second processing paths.

33. The system of claim 31, wherein said differential network includes:
first and second invertible samplers that include said signal inverters to thereby provide differential samples of said first and second signal portions in said first processing mode and invert said differential samples in said second processing mode; and
a plurality of differential converter stages that successively convert said differential samples to corresponding digital signals which form said output signals; and a digital inverter that forms said terminal signal inverter and inverts said digital signals in said second processing mode.

34. The system of claim 33, wherein each of said invertible samplers includes:
   a reversible-capacitor network that respectively presents first and second capacitors in a first arrangement in a first sampling mode and in a reversed arrangement in a second sampling mode; and
   a switch positioned to couple one of said first and second signal portions through said first and second capacitors.

35. The system of claim 34, wherein each of said reversible-capacitor networks includes:
   first and second reversing switches; and
   a capacitor coupled between said reversing switches.

36. The system of claim 35, wherein each of said invertible samplers includes:
   a first buffer transistor inserted before said first reversible-capacitor network; and
   a second buffer transistor inserted before said second reversible-capacitor network.

37. The system of claim 31, wherein said mode-selection generator is a random number generator.

* * * * *

UNITED STATES PATENT AND TRADEMARK OFFICE
CERTIFICATE OF CORRECTION

PATENT NO.        : 7,034,736 B1                                          Page 1 of 1
APPLICATION NO.   : 10/980051
DATED             : April 25, 2006
INVENTOR(S)       : Ahmed Mohamed Abdelatty Ali It is certified that error appears in the above-identified patent and that said Letters Patent is hereby corrected as shown below:

In claim 22, line 31, change the word "alone" to --along--.

Signed and Sealed this

Fifth Day of June, 2007

JON W. DUDAS
*Director of the United States Patent and Trademark Office*